United States Patent
Kolan et al.

(10) Patent No.: US 10,496,449 B1
(45) Date of Patent: Dec. 3, 2019

(54) VERIFICATION OF ATOMIC MEMORY OPERATIONS

(71) Applicant: International Business Machines Corporation, Armonk, NY (US)

(72) Inventors: Tom Har'el Kolan, Haifa (IL); Hillel Mendelson, Kibbutz Hahotrim (IL); Vitali Sokhin, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/004,555

(22) Filed: Jun. 11, 2018

(51) Int. Cl.
| G06F 9/52 | (2006.01) |
| G06F 9/54 | (2006.01) |
| G06F 9/30 | (2018.01) |
| G06F 9/46 | (2006.01) |
| G06F 11/22 | (2006.01) |
| G06F 11/263 | (2006.01) |

(52) U.S. Cl.
CPC ............ G06F 9/526 (2013.01); G06F 9/3004 (2013.01); G06F 9/467 (2013.01); G06F 9/544 (2013.01); G06F 11/2242 (2013.01); G06F 11/263 (2013.01); G06F 2209/521 (2013.01)

(58) Field of Classification Search
CPC .......... G06F 9/526; G06F 9/528; G06F 9/544; G06F 11/22442; G06F 11/26; G06F 11/263
See application file for complete search history.

(56) References Cited

U.S. PATENT DOCUMENTS

| 8,099,726 B2 | 1/2012 | Harris | |
| 8,838,900 B2 | 9/2014 | Lin et al. | |
| 2008/0209176 A1* | 8/2008 | Singh | G06F 15/16 |
| | | | 712/214 |
| 2008/0288834 A1* | 11/2008 | Manovit | G06F 11/28 |
| | | | 714/718 |
| 2009/0164861 A1* | 6/2009 | Tseng | G06F 11/263 |
| | | | 714/739 |

(Continued)

OTHER PUBLICATIONS

Adir et al. "Verification of Transactional Memory in POWER8." 2014. ACM. DAC '14. (Year: 2014).*

(Continued)

*Primary Examiner* — Nathan Sadler
(74) *Attorney, Agent, or Firm* — Ziv Glazburg

(57) ABSTRACT

A computer-implemented method, computerized apparatus and computer program product for verification of atomic memory operations are disclosed. The method comprising: independently generating for each of a plurality of threads at least one instruction for performing an atomic memory operation of a predetermined type on an allocated shared memory location accessed by the plurality of threads; and, determining an evaluation function over arguments comprising values operated on or obtained in performing the atomic memory operation of the predetermined type on the allocated shared memory location by each of the plurality of threads; wherein the evaluation function is determined based on the atomic memory operation of the predetermined type such that a result thereof is not effected by an order in which each of the plurality of threads performs the atomic memory operation of the predetermined type on the allocated shared memory location.

19 Claims, 2 Drawing Sheets

(56) References Cited

U.S. PATENT DOCUMENTS

Figure 1:
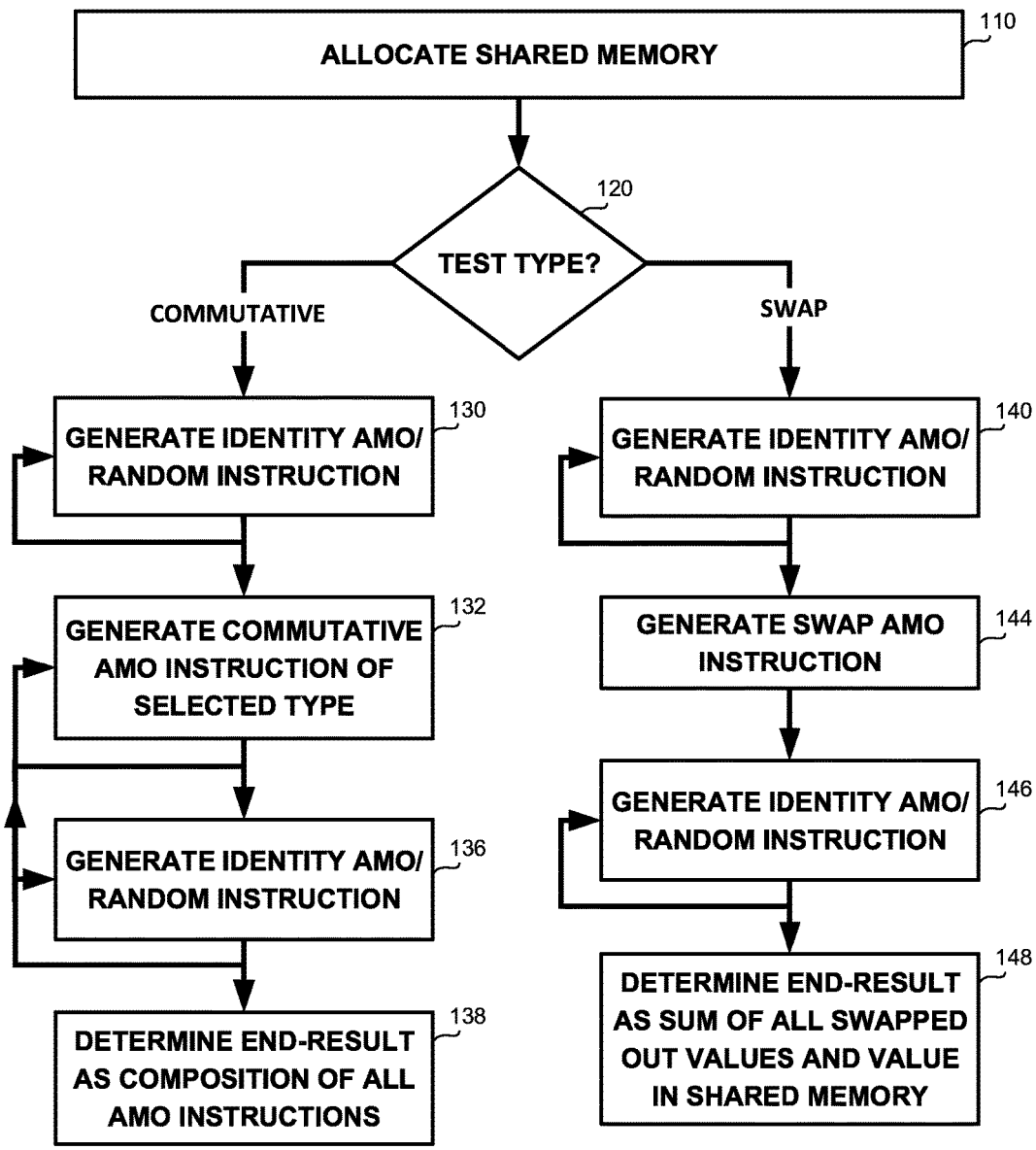

| | | | |
|---|---|---|---|
| 2009/0328045 A1* | 12/2009 | Burckhardt | G06F 9/3842 718/102 |
| 2010/0088680 A1 | 4/2010 | Ganai et al. | |
| 2016/0357551 A1 | 12/2016 | Wood et al. | |

OTHER PUBLICATIONS

David S. Miller. "Documentation/atomic_ops.txt (v3.17)." Aug. 2014. https://lwn.net/Articles/608551/. (Year: 2014).*

McKenney et al. "Axiomatic validation of memory barriers and atomic instructions." Aug. 2014. https://lwn.net/Articles/608550/. (Year: 2014).*

Maranget. "litmus/C-AlanStern-Atomict1.litmus." Jun. 2017. https://github.conn/paulmckrcu/litmus/blob/master/manual/atomic/C-AlanStern-Atomict1.litmus. (Year: 2017).*

Maranget. "litmus/C-atomic-00.litmus." Jun. 2017. https://github.com/paulmckrcu/litmus/blob/master/manual/atomic/C-atomic-00.litmus. (Year: 2017).*

Maranget. "litmus/C-atomic-01.litmus." Jun. 2017. https://github.com/paulmckrcu/litmus/blob/master/manual/atomic/C-atomic-01.litmus. (Year: 2017).*

Maranget. "litmus/C-atomic-02.litmus." Jun. 2017. https://github.com/paulmckrcu/litmus/blob/master/manual/atomic/C-atomic-02.litmus. (Year: 2017).*

Maranget. "litmus/C-atomic-03.litmus." Jun. 2017. https://github.com/paulmckrcu/litmus/blob/master/manual/atomic/C-atomic-03.litmus. (Year: 2017).*

Maranget. "litmus/C-atomic-04.litmus." Jun. 2017. https://github.conn/paulnnckrcu/litnnus/blob/master/manual/atomic/C-atomic-04.litmus. (Year: 2017).*

Maranget. "litmus/C-MP-o-A-o+o-A-o.litmus." Feb. 2018. https://github.com/paulmckrcu/litmus/blob/master/manual/kernel/C-MP-o-A-o%2Bo-A-o.litmus. (Year: 2018).*

Maranget. "litmus/C-MPrelseq+o-r+rmwinc+a-o.litmus." Sep. 2017. https://github.com/paulmckrcu/litmus/blob/master/manual/kernel/C-MPrelseq%2Bo-r%2Brmwinc%2Ba-o.litmus. (Year: 2017).*

Maranget. "litmus/C-noatomic-03.litmus." Jun. 2017. https://github.com/paulmckrcu/litmus/blob/master/manual/atomic/C-noatomic-03.litmus. (Year: 2017).*

Maranget. "litmus/C-PaulEMcKenney-SB+adat-o+adat-o.litmus." Jun. 2017. https://github.com/paulmckrcu/litmus/blob/master/manual/atomic/C-PaulEMcKenney-Sb%2Badat-o%2Badat-o.litmus. (Year: 2017).*

Dan Negrut, "CUDA Shared Memory. Synchronization. Atomic operations", High Performance Computing for Engineering Applications, University of Wisconsin-Madison, Mar. 8, 2012.

* cited by examiner

VERIFICATION OF ATOMIC MEMORY OPERATIONS

TECHNICAL FIELD

The present disclosure relates to computer engineering in general, and to testing correct execution of atomic memory operations, in particular.

BACKGROUND

Computerized systems and tools nowadays aid or control almost every aspect of human life, from typing documents to managing traffic lights. However, computerized systems are bug-prone, and thus require a testing phase in which the bugs should be discovered. The testing phase is considered one of the most difficult tasks in designing a computerized system. The cost of not discovering a bug prior to shipment or distribution of the computerized system to end-users or downstream manufacturers, for example, may be enormous, as well as even result in disastrous outcomes. For example, a bug may cause the injury of a person relying on a designated behavior of the computerized system. Additionally, a bug in hardware or firmware may be expensive to fix, as patching it requires call-back of the malfunctioned component. Hence, many developers of computerized systems invest a substantial portion of the development cycle to discover erroneous behaviors of the computerized system.

During testing phase, developers, verification engineers, QA staff members, and the like, test a newly developed design to verify that it operates properly. In some cases, test cases (also referred to simply as "tests") may be devised to provide stimuli to the component, and enable testing whether its operation is correct (e.g., as expected). A first type of testing is pre-silicon verification. In this process, a design is simulated and tested in a virtual environment, thus providing the developer with high degree of observability, i.e. ability to see all signals in almost all times. On the other hand, the amount of cycles that can be generated during such simulations is fairly limited. A second type of testing is post-silicon verification, wherein tests are performed on actual physical implementation of the design (e.g., a chip after being taped-out from fabrication), in conditions up to scale with real-world systems such as ones commercially available. While post-silicon validation platforms are in orders of magnitude faster than any simulation, they suffer from low degree of observability, and the design is basically considered as a black box in this stage.

One approach to post-silicon verification is the use of exercisers. An exerciser is a unique type of a software based self-test that, once loaded to the system, continuously generates test-cases, executes them, and checks the results. The generated test-cases are required to be valid programs for the tested design to execute, as well as sufficiently complex so as to stress the design and trigger meaningful events in various areas. There are several types of checking mechanisms for post-silicon verification that are applicable in exercisers. One mechanism is design self-checks, which consist of in-place assertions causing a failure and are not specific to the software running at the time. Another mechanism is tool self-checks, using assertions in the verification tool itself (e.g., a value of a register X must be zero). Yet another mechanism is multi-pass consistency checks, wherein a test-case is run once and the architected results are saved. Then the test-case is run again for a number of times and the end-of-test results are compared to the result of the first pass. The premise of multi-pass consistency testing is that if the system under test functions correctly, the end-of-test results should be the same in all passes. Therefore an inconsistency detected is presumed to indicate a malfunction.

BRIEF SUMMARY

One exemplary embodiment of the disclosed subject matter is a computer-implemented method comprising: independently generating for each of a plurality of threads at least one instruction for performing an atomic memory operation of a predetermined type on an allocated shared memory location accessed by the plurality of threads; and, determining an evaluation function over arguments comprising values operated on or obtained in performing the atomic memory operation of the predetermined type on the allocated shared memory location by each of the plurality of threads; wherein the evaluation function is determined based on the atomic memory operation of the predetermined type such that a result thereof is not effected by an order in which each of the plurality of threads performs the atomic memory operation of the predetermined type on the allocated shared memory location.

Optionally, the predetermined type of the atomic memory operation is selected from a predetermined set of commutative atomic memory operations, and the evaluation function is a composition of all atomic memory operations of the predetermined type performed on the allocated shared memory location.

Optionally, the commutative atomic memory operations in the predetermined set are selected from the group consisting of: an ADD operation; an OR operation; an AND operation; a XOR operation; a MIN operation; a MAX operation; and any combination thereof.

Optionally, the predetermined type of the atomic memory operation is selected from the predetermined set at random.

Optionally, said generating comprising assigning a value for each operand of the atomic memory operation other than the allocated shared memory location.

Optionally, the value is selected at random.

Optionally, the predetermined type of atomic memory operation is a swap operation, and the evaluation function is a sum of all values swapped out in performing the swap operation by the plurality of threads and the value in the allocated shared memory subsequently to all threads having performed the swap operation.

Optionally, the method further comprising generating for one or more of the plurality of threads at least one instruction for performing an identity atomic memory operation before or after the atomic memory operation of the predetermined type, wherein the at least one identity atomic memory operation is configured to leave a content of the allocated shared memory unchanged after being performed thereon.

Optionally, a plurality of shared memory locations separately allocated are used, wherein said generating at least one instruction and determining an evaluation function are performed independently for each of the plurality of shared memory locations.

Another exemplary embodiment of the disclosed subject matter is a computerized apparatus having a processor and coupled memory, the processor being adapted to perform the steps of: independently generating for each of a plurality of threads at least one instruction for performing an atomic memory operation of a predetermined type on an allocated shared memory location accessed by the plurality of threads; and, determining an evaluation function over arguments comprising values operated on or obtained in performing the atomic memory operation of the predetermined type on the allocated shared memory location by each of the plurality of threads; wherein the evaluation function is determined based on the atomic memory operation of the predetermined type such that a result thereof is not effected by an order in which each of the plurality of threads performs the atomic memory operation of the predetermined type on the allocated shared memory location.

Yet another exemplary embodiment of the disclosed subject matter is a computer program product comprising a non-transitory computer readable storage medium retaining program instructions, which program instructions when read by a processor, cause the processor to perform a method comprising: independently generating for each of a plurality of threads at least one instruction for performing an atomic memory operation of a predetermined type on an allocated shared memory location accessed by the plurality of threads; and, determining an evaluation function over arguments comprising values operated on or obtained in performing the atomic memory operation of the predetermined type on the allocated shared memory location by each of the plurality of threads; wherein the evaluation function is determined based on the atomic memory operation of the predetermined type such that a result thereof is not effected by an order in which each of the plurality of threads performs the atomic memory operation of the predetermined type on the allocated shared memory location.

THE BRIEF DESCRIPTION OF THE SEVERAL VIEWS OF THE DRAWINGS

Figure 2:
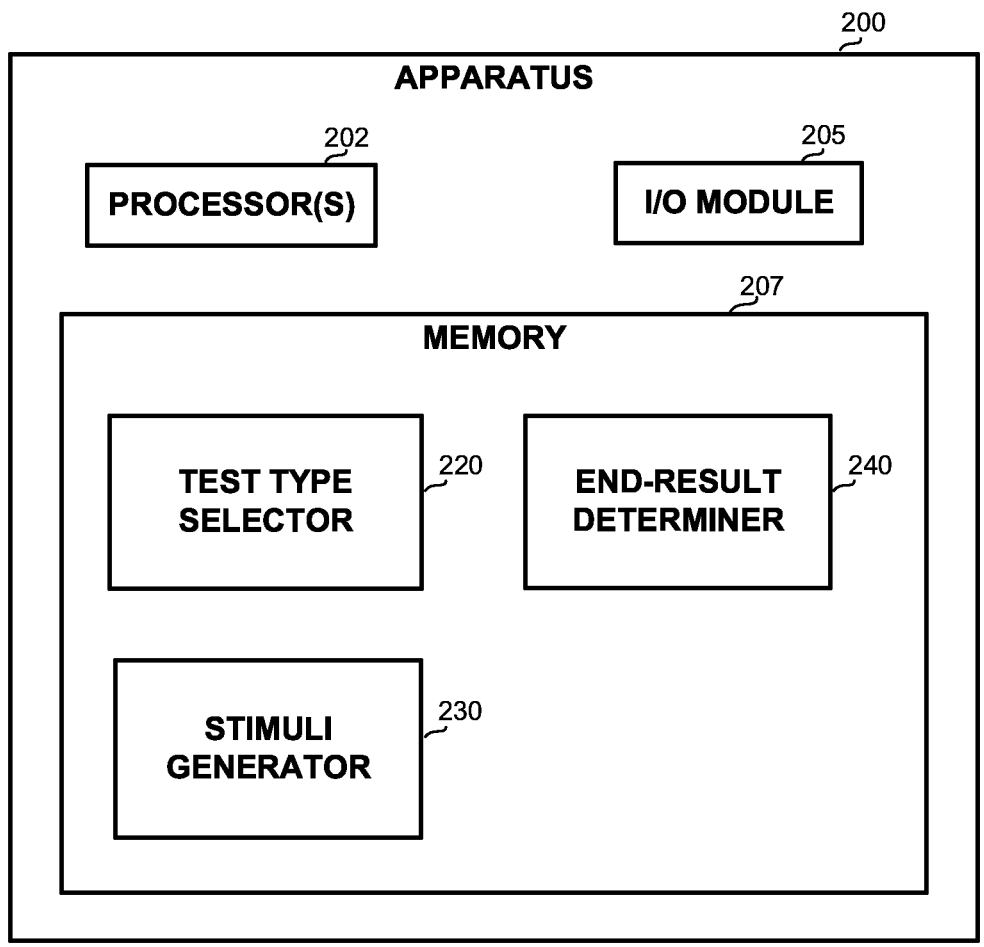

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIG. 1 shows a flowchart diagram of a method, in accordance with some exemplary embodiments of the disclosed subject matter; and FIG. 2 shows a block diagram of an apparatus, in accordance with some exemplary embodiments of the disclosed subject matter.

DETAILED DESCRIPTION

In some types of applications, a storage location may be updated frequently by multiple different execution threads. The latency of bringing the data to the local cache and then casting it out for another processor, process or program section to use may become a bottleneck for the application. One approach to cope with this issue is to implement an execution unit and associated queuing and buffering in or near the memory controller. This approach is known as Processing-in-Memory (PIM). One type of near memory operations is atomic memory operations (AMOs), as featured for example in version ISA 3.0 of the POWER architecture. AMOs may be used to replace or improve efficiency of common multiprogramming concepts such as locks, shared data (e.g. counters), sharding, and the like.

One technical problem dealt with by the disclosed subject matter is to generate test cases for verification of atomic memory operations. Verification of atomic memory operations poses several challenges. An essential feature of AMO instructions is atomicity. In order to verify atomicity, AMOs from multiple threads or different processes may need to access the same memory location, possibly in parallel. For example, the shared memory resource may represent a bank account balance, and the multiple accesses may be deposits being made to the account at a same time, and that need to be updated simultaneously. Such requirement of parallel access is colloquially known as "true sharing". In this type of scenario, using self-checks may be too intrusive. Conventional methods for verifying locking mechanisms, consisting of lock-acquiring, updating and lock-releasing are not applicable either for AMOs. On the other hand, in verification environments that heavily rely on multi-pass consistency checking, such as post-silicon or emulation verification, it may not be possible to verify atomicity using randomly generated AMO instructions, since each execution of an AMO instruction may be expected to modify memory content, at least in the general case, yet the order of execution, however, may not be predicted. As a consequence, even if the system operates correctly, multiple executions of the same test case may not be guaranteed to yield the same end-of-test results. As an illustrative example, consider a test case in which one thread performs an addition operation and another thread performs a multiplication operation. The end result may be different in case the order of operations is reversed in repeated execution, although the system may be functioning correctly.

One technical solution is to select a commutative atomic memory operation to be executed by all participating threads on a truly shared memory location, i.e. one being accessed by each of the multiple threads. The commutative atomic memory operation may be, for example, an ADD operation, i.e. addition of an arbitrary value. As another example, the commutative atomic memory operation may be a logical OR, AND, or XOR (exclusive-or) operation. As yet another example, the commutative atomic memory operation may be a MIN or MAX operation, i.e. one that returns a minimum or maximum value of its operands, respectively. By choosing an operation of this type, the end result may be expected to remain unchanged regardless of the execution order. The operation may be chosen at random from a predetermined set of supported commutative AMOs. Similarly, the value to be used as operand together with the stored value in the shared memory location may either be randomly chosen or predetermined. For any or all threads, an arbitrary number of truly shared AMOs of the type selected may be utilized in generation of a test case.

Another technical solution is to select an identity atomic memory operation to be executed by one or more threads on the truly shared memory location. An identity operation, formally defined as a function $f(x)=x$ may be an operation expected to leave content of the memory unchanged. Thus, any AMOs of this type may target a same memory location without affecting end-of-test consistency. Exemplary identity operations may include swap a same value as stored, add zero, multiply by one, or the like. An arbitrary number of truly shared identity AMOs of a same or different type for any or all threads may be used in generating the test case, additionally or alternatively to use of commutative AMOs of a selected type.

Yet another technical solution is to have each thread perform an unconditional atomic swap operation in which a predetermined value is swapped in and a stored value is swapped out of the truly shared memory location, and wherein the shared memory is initially assigned with a value that is also predetermined. For example, each thread may swap in its own thread_id number, and the initial value may be zero. The swapped out values may be accumulated, and added to or summed up together with the value in the shared memory at the end of run, wherein the overall sum is then regarded as the final result of the test. Since summation is a commutative operation, the final result does not depend on the ordering of execution and is thus multi-pass consistent. In some exemplary embodiments, one or more identity AMOs may be interleaved among the swap operations as well.

In some exemplary embodiments, a test case may be generated wherein a plurality of separate allocations of truly shared memory are used, such that for each one of these locations AMOs of a different type may be utilized. For example, one or more locations may be utilized to test commutative AMOs of a selected type, e.g. a first location to test ADD operations, a second location to test OR operations, a third location to test AND operations, and so forth. Additionally or alternatively, one or more other locations may be utilized to test swap operations. Identity AMOs may be introduced before and/or after any one of the generated commutative or swap AMOs.

One technical effect of utilizing the disclosed subject matter is to allow generation at random of stimuli for verification of atomic memory operations, such that multi-pass consistency may be held. The generated stimuli may comprise any arbitrary large number of threads accessing a same shared memory location, any arbitrary number of instructions to be performed by any or all participating threads, and any arbitrary number of truly shared memory locations to be allocated at each test run and accessed by a plurality of threads in parallel, thus allowing for genuine stressing of the design in run-time. The disclosed subject matter provides for generation of a tight test-case in which all threads are directed to execute AMOs substantially in parallel.

It will be appreciated that test generation in accordance with the disclosed subject matter may be done on platform. Each thread may generate test instructions independently of all other threads, and optionally in parallel thereto. In particular, one thread need not relate or constraint itself to another thread. In some exemplary embodiments, threads may be assigned with roles, in accordance with alternative methods of testing used. For different roles separate allocations of memory may be used, as well as separate generation sequences, wherein each thread may generate AMO instructions according to its role. For example, a commutative thread may generate one or more AMO instructions for performing a commutative operation of a type selected, e.g. ADD, OR, XOR and the like. The commutative thread may thus choose which value to use as operand together with the stored value in the shared memory operated on, e.g. which value to add. The commutative thread may further choose one or more random instructions to be included in the generated test case before and/or after the AMO in question. For this purpose, any kind of instruction that is supported by the design under test may be utilized. The commutative thread may further yet choose one or more identity operations to be included in the test and generate identity AMO instructions accordingly. Similarly, a swap thread may generate a swap AMO instruction for swapping out a value stored in the shared memory by a swapped in value which may be either deterministically specified or randomly chosen in the generation phase. The swap thread may also similarly choose one or more random instructions before and/or after the swap AMO, as well as identity operations, in the same manner as in the case of commutative threads.

The disclosed subject matter may provide for one or more technical improvements over any pre-existing technique and any technique that has previously become routine or conventional in the art. Additional technical problem, solution and effects may be apparent to a person of ordinary skill in the art in view of the present disclosure.

Referring now to FIG. 1 showing a flowchart diagram of a method, in accordance with some exemplary embodiments of the disclosed subject matter.

On Step 110, a shared memory location may be allocated. The shared memory location may be accessible to multiple threads. The multiple threads or a portion thereof may access the shared memory location and update a value stored therein, optionally in parallel or at least in a seemingly parallel fashion. The shared memory location may be initialized with an initial value. The initial value may be chosen at random or deterministically, for example it may be set to zero.

On Step 120, a type of testing method may be determined, wherein a different generation of a test case and check of an end result may be employed for each type. In case of determination that testing of commutative operations is to be provided for, the method may continue to Step 130. Otherwise, in case of determining that swap operations testing is required, the method may continue to Step 140.

On Step 130, an instruction for performing an identity atomic memory operation on the shared memory location allocated on Step 110, or a random instruction may be generated. The instruction may be identical for all participating threads or a portion thereof, or it may be different for each thread. In some exemplary embodiments, Step 130 may be repeated for an arbitrary number of times. Alternatively, Step 130 may be skipped entirely and the method may continue directly from Step 120 to Step 132.

On Step 132, an instruction for performing a commutative atomic memory operation of a selected type on the shared memory location allocated on Step 110 may be generated. The type of the commutative atomic memory operation, such as, for example, an ADD, OR, AND, XOR, MIN, MAX operation or the like, may be selected at random. The random selection may be coordinated among the multiple threads by using a Pseudo Random Number Generator (RNG) with a same seed value, such that an operation of the same type is selected for all threads. Each thread may select a value for each operand of the selected operation other than the operand corresponding the shared memory location and stored value thereof. For example, in case of an ADD operation, each thread may select a value to be added to a stored value in the shared memory location. The value of each operand may be selected at random, either using a same seed for all threads or a different one for each. Step 132 may be repeated an arbitrary number of times. Alternatively, the method may continue to Step 136.

On Step 136, an instruction for performing an identity atomic memory operation on the shared memory location, or a random instruction, may be generated, similarly as in Step 130. Step 136 may be repeated any number of times, and thereafter the method may either go back to Step 132 or continue to Step 138. Alternatively, Step 136 may be skipped and the method may go directly to Step 138.

On Step 138, an end-result evaluation function may be determined as a composition of all AMO instructions generated throughout Steps 130 to 136 for all participating threads. The composited instructions may be expected to yield the same value as the one residing in the shared memory location subsequently after all threads finished performing their respective instructions.

It will be appreciated that by repeating either one of Steps 130 to Steps 136 and/or repeatedly going back through Steps 132 to 136 any arbitrary number of times, a stimulus of an arbitrary length may be generated. It will further be appreciated that the stimulus may be randomly generated, at least with respect to the commutative operation used and/or values on which the commutative AMOs are to operate, in conjunction with a value in the shared memory.

On Step 140, an instruction for performing an identity atomic memory operation on the shared memory location, or a random instruction, may be generated, similarly as in Steps 130 and 136. Step 140 may be performed one or more times or skipped entirely and the method may go straight from Step 120 to Step 144.

On Step 144, an instruction for performing a swap atomic memory operation on the shared memory location allocated on Step 110 may be generated. The swap AMO instruction may be designed to swap out a value stored in the shared memory location, and swap in instead a selected value. The selected value may be chosen for each thread at random or in a deterministic fashion, e.g. thread_id number or the like. The generated instruction may further entail keeping record of the value being swapped out so that it may be utilized thereafter in an end-of-test result calculation.

On Step 146, an instruction for performing an identity atomic memory operation on the shared memory location, or a random instruction, may be generated, similarly as in Steps 130, 136 and 140. Step 146 may be performed one or more times or it may be skipped entirely and the method may continue to Step 148.

On Step 148, an end-result evaluation function may be determined as a sum of all values that have been swapped out by a swap AMO and a value present in the shared memory location. The swapped out values may be either accumulated throughout execution of the instructions generated in Steps 140 to 146 or they may be saved in data storage during it and retrieved and summed up together at the end.

It will be appreciated that Steps 130 to 138 or Steps 140 to 148 may be performed for the plurality of participating threads either by each thread for itself or by an external process for all threads. It will further be appreciated that Steps 110 to 148 may be repeated for a plurality of shared memory allocations, whereby allowing for different types of testing methods to be used and/or for testing of different types of commutative operations to be performed concurrently, as well as for optionally stressing a large amount of memory.

Referring now to FIG. 2 showing a block diagram of an apparatus, in accordance with some exemplary embodiments of the disclosed subject matter. An Apparatus 200 may be configured to support parallel user interaction with a real world physical system and a digital representation thereof, in accordance with the disclosed subject matter.

In some exemplary embodiments, Apparatus 200 may comprise one or more Processor(s) 202. Processor 202 may be a Central Processing Unit (CPU), a microprocessor, an electronic circuit, an Integrated Circuit (IC) or the like. Processor 202 may be utilized to perform computations required by Apparatus 200 or any of it subcomponents.

In some exemplary embodiments of the disclosed subject matter, Apparatus 200 may comprise an Input/Output (I/O) module 205. I/O Module 205 may be utilized to provide an output to and receive input from a user, such as, for example, reporting any inconsistency detected in multiple executions of a same test case, specifying test generation or test execution parameters (e.g., number of instructions per test case, number of repeated passes, etc.), or the like.

In some exemplary embodiments, Apparatus 200 may comprise Memory 207. Memory 207 may be a hard disk drive, a Flash disk, a Random Access Memory (RAM), a memory chip, or the like. In some exemplary embodiments, Memory 207 may retain program code operative to cause Processor 202 to perform acts associated with any of the subcomponents of Apparatus 200. Memory 207 may comprise one or more allocations of shared memory locations, such as obtained in Step 110 of FIG. 1.

Test Type Selector 220 may be configured to select a type of testing method by which verification of AMOs may be performed, similarly as in Step 120 of FIG. 2. In some exemplary embodiments, Test Type Selector 220 may specify the test type for each participating thread or a generation process. Test Type Selector 220 may be configured to select between testing of commutative operations and testing of swap operations. Test Type Selector 220 may be further configured to select a type of a commutative operation to be performed by a plurality of threads in parallel.

Stimuli Generator 230 may be configured to generate stimuli comprising at least one atomic memory operation instruction to be performed by each participating thread on an allocated shared memory location. Stimuli Generator 230 may generate a stimulus comprising AMOs of a type conforming to the type of testing method selected by Test Type Selector 220. Stimuli Generator 230 may be configured to generate a swap AMO instruction or one or more commutative AMO instructions of a type selected by Test Type Selector 220. Stimuli Generator 230 may be further configured to generate one or more identity AMO instructions, one or more random instructions, or the like. Stimuli Generator 230 may generate the stimulus similarly as in Steps 130 to 136 or Steps 140 to 146 of FIG. 1.

End-Result Determiner 240 may be configured to determine an end-result evaluation function, similarly as in Step 138 or Step 148 of FIG. 1. End-Result Determiner 240 may determine the evaluation function based of the type of testing method selected by Test Type Selector 220. In case of commutative operations testing, End-Result Determiner 240 may determine the evaluation function as a composition of all AMO instructions performed by the plurality of threads on the shared memory location. Otherwise in case of swap operations testing, End-Result Determiner 240 may determine the evaluation function as a sum of all swapped out values and a final value stored in the shared memory location. In some exemplary embodiments, End-Result Determiner 240 may be configured to run a test case generated by Stimuli Generator 240 a multiple number of times and compare a result returned in each by the evaluation function determined, whereby detecting whether an inconsistency arises.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the is singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
   independently generating for each of a plurality of threads at least one instruction for performing an atomic memory operation of a predetermined type on an allocated shared memory location accessed by the plurality of threads; and,
   determining an evaluation function over arguments comprising values operated on or obtained in performing the atomic memory operation of the predetermined type on the allocated shared memory location by each of the plurality of threads;
   wherein the evaluation function is determined based on the atomic memory operation of the predetermined type such that a result thereof is not effected by an order in which each of the plurality of threads performs the atomic memory operation of the predetermined type on the allocated shared memory location.

2. The computer-implemented method of claim 1, wherein the predetermined type of the atomic memory operation is selected from a predetermined set of commutative atomic memory operations, wherein the evaluation function is a composition of all atomic memory operations of the predetermined type performed on the allocated shared memory location.

3. The computer-implemented method of claim 2, wherein the commutative atomic memory operations in the predetermined set are selected from the group consisting of: an ADD operation; an OR operation; an AND operation; a XOR operation; a MIN operation; a MAX operation; and any combination thereof.

4. The computer-implemented method of claim 2, wherein the predetermined type of the atomic memory operation is selected from the predetermined set at random.

5. The computer-implemented method of claim 1, wherein said generating comprising assigning a value for each operand of the atomic memory operation other than the allocated shared memory location.

6. The computer-implemented method of claim 5, wherein the value is selected at random.

7. The computer-implemented method of claim 1, wherein the predetermined type of atomic memory operation is a swap operation, wherein the evaluation function is a sum of all values swapped out in performing the swap operation by the plurality of threads and the value in the allocated shared memory subsequently to all threads having performed the swap operation.

8. The computer-implemented method of claim 1, further comprising generating for one or more of the plurality of threads at least one instruction for performing an identity atomic memory operation before or after the atomic memory operation of the predetermined type, wherein the at least one identity atomic memory operation is configured to leave a content of the allocated shared memory unchanged after being performed thereon.

9. The computer-implemented method of claim 1, wherein a plurality of shared memory locations separately allocated are used, wherein said generating at least one instruction and determining an evaluation function are performed independently for each of the plurality of shared memory locations.

10. A computerized apparatus having a processor and coupled memory, the processor being adapted to perform the steps of:
    independently generating for each of a plurality of threads at least one instruction for performing an atomic memory operation of a predetermined type on an allocated shared memory location accessed by the plurality of threads; and,
    determining an evaluation function over arguments comprising values operated on or obtained in performing the atomic memory operation of the predetermined type on the allocated shared memory location by each of the plurality of threads;
    wherein the evaluation function is determined based on the atomic memory operation of the predetermined type such that a result thereof is not effected by an order in which each of the plurality of threads performs the atomic memory operation of the predetermined type on the allocated shared memory location.

11. A computer program product comprising a non-transitory computer readable storage medium retaining program instructions, which program instructions when read by a processor, cause the processor to perform a method comprising:
    independently generating for each of a plurality of threads at least one instruction for performing an atomic memory operation of a predetermined type on an allocated shared memory location accessed by the plurality of threads; and,
    determining an evaluation function over arguments comprising values operated on or obtained in performing the atomic memory operation of the predetermined type on the allocated shared memory location by each of the plurality of threads;
    wherein the evaluation function is determined based on the atomic memory operation of the predetermined type such that a result thereof is not effected by an order in which each of the plurality of threads performs the atomic memory operation of the predetermined type on the allocated shared memory location.

12. The computer program product of claim 11, wherein the predetermined type of the atomic memory operation is selected from a predetermined set of commutative atomic memory operations, wherein the evaluation function is a composition of all atomic memory operations of the predetermined type performed on the allocated shared memory location.

13. The computer program product of claim 12, wherein the commutative atomic memory operations in the predetermined set are selected from the group consisting of: an ADD operation; an OR operation; an AND operation; a XOR operation; a MIN operation; a MAX operation; and any combination thereof.

14. The computer program product of claim 12, wherein the predetermined type of the atomic memory operation is selected from the predetermined set at random.

15. The computer program product of claim 11, wherein said generating comprising assigning a value for each operand of the atomic memory operation other than the allocated shared memory location.

16. The computer program product of claim 15, wherein the value is selected at random.

17. The computer program product of claim 11, wherein the predetermined type of atomic memory operation is a swap operation, wherein the evaluation function is a sum of all values swapped out in performing the swap operation by the plurality of threads and the value in the allocated shared memory subsequently to all threads having performed the swap operation.

18. The computer program product of claim 11, wherein said program instructions further cause the processor to generate for one or more of the plurality of threads at least one instruction for performing an identity atomic memory operation before or after the atomic memory operation of the predetermined type, wherein the at least one identity atomic memory operation is configured to leave a content of the allocated shared memory unchanged after being performed thereon.

19. The computer program product of claim 11, wherein said program instructions further cause for usage of a plurality of shared memory locations separately allocated, wherein said generating at least one instruction and determining an evaluation function are performed independently for each of the plurality of shared memory locations.

* * * * *